United States Patent
Park et al.

(10) Patent No.: US 8,999,626 B2
(45) Date of Patent: Apr. 7, 2015

(54) POLYMER COMPOUND COMPRISING DYE AND CURABLE RESIN COMPOSITION COMPRISING SAME

(75) Inventors: Jiyoung Park, Daejeon (KR); Sunhwa Kim, Daejeon (KR); Janghyun Ryu, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/006,272

(22) PCT Filed: May 25, 2012

(86) PCT No.: PCT/KR2012/004174
§ 371 (c)(1),
(2), (4) Date: Sep. 19, 2013

(87) PCT Pub. No.: WO2013/018987
PCT Pub. Date: Feb. 7, 2013

(65) Prior Publication Data
US 2014/0011135 A1    Jan. 9, 2014

(30) Foreign Application Priority Data

Aug. 4, 2011 (KR) .................. 10-2011-0077768

(51) Int. Cl.
| | | |
|---|---|---|
| G03F 7/028 | (2006.01) |
| G03F 7/032 | (2006.01) |
| G03F 7/085 | (2006.01) |
| C08F 226/06 | (2006.01) |
| C08F 218/02 | (2006.01) |
| C08F 20/10 | (2006.01) |
| C08F 220/18 | (2006.01) |
| C08J 3/20 | (2006.01) |
| C08L 33/14 | (2006.01) |
| G03F 7/027 | (2006.01) |
| G03F 7/033 | (2006.01) |
| C08F 220/06 | (2006.01) |

(52) U.S. Cl.
CPC .............. G03F 7/032 (2013.01); C08F 20/10 (2013.01); C08F 220/06 (2013.01); C08F 220/18 (2013.01); C08F 226/06 (2013.01); C08F 2220/1841 (2013.01); C08J 3/20 (2013.01); C08J 2300/10 (2013.01); C08L 33/14 (2013.01); G03F 7/027 (2013.01); G03F 7/033 (2013.01)

(58) Field of Classification Search
None
See application file for complete search history.

(56) References Cited

U.S. PATENT DOCUMENTS

| | | | |
|---|---|---|---|
| 8,633,260 B2 * | 1/2014 | Park et al. ................ 522/111 |
| 2003/0113664 A1 | 6/2003 | Berneth et al. |
| 2003/0229163 A1 | 12/2003 | Araki |
| 2004/0102548 A1 | 5/2004 | Suzuki |
| 2006/0089421 A1 | 4/2006 | Vasudevan |

FOREIGN PATENT DOCUMENTS

| | | | |
|---|---|---|---|
| JP | 2006-267923 | * | 10/2006 |
| JP | 4113123 B2 | | 4/2008 |
| JP | 2009-215397 A | | 9/2009 |
| JP | 2012-46712 | * | 3/2012 |
| KR | 2003-0078752 A | | 10/2003 |
| KR | 10-2004-0041070 A | | 5/2004 |
| KR | 10-2010-0026459 A | | 3/2010 |

OTHER PUBLICATIONS

Derwent English abstract for JP 2006-267923 (2006).*
Machine-assisted English translation of JP 2006-267923, as provided by JPO (2006).*
Derwent English abstract for JP2012-46712 (2012).*
Machine-assisted English translation of JP2012-46712 (2012).*
Office Action issued in Korean Patent Application No. 10-2012-0056039 on Aug. 23, 2013 along with English translation, 9 pages.

* cited by examiner

*Primary Examiner* — Sin J. Lee
(74) *Attorney, Agent, or Firm* — Rothwell, Figg, Ernst & Manbeck, P.C.

(57) ABSTRACT

The present invention relates to a polymer compound including a dye, and a curable resin composition including the same. The polymer compound including the dye according to the present invention may exhibit characteristics such as excellent heat resistance, solubility, coating uniformity, chemical resistance and the like by introducing a single molecule type dye into a side chain of a polymer binder to be modified into a polymer form and applying the modified polymer to a curable composition.

17 Claims, 4 Drawing Sheets

POLYMER COMPOUND COMPRISING DYE AND CURABLE RESIN COMPOSITION COMPRISING SAME

TECHNICAL FIELD

The present application is a 35 U.S.C. §371 National Phase Entry Application from PCT/KR2012/004174, filed May 25, 2012, and designating the United States, which claims priority from Korean Patent Application No. 10-2011-0077768, filed on Aug. 4, 2011 at the KIPO, the disclosure of which is incorporated herein by reference in its entirety.

The present specification relates to a polymer compound including a dye having excellent heat resistance, solubility, coating uniformity, chemical resistance and the like, and a curable resin composition including the same.

BACKGROUND ART

A curable resin composition may be applied on a substrate to form a paint film and used to form a pattern by subjecting a specific portion of the paint film to exposure by light irradiation using a photomask and the like and then subjecting a non-exposure portion to a development treatment to remove the non-exposure portion. This curable resin composition has been used for a photocurable ink, a photosensitive printing plate, various photoresists, a color filter photoresist for a LCD, a photoresist for a resin black matrix, a transparent photosensitive material or the like since the curable resin composition may be polymerized and cured by light irradiation.

The curable resin composition usually includes an alkali soluble resin, a polymerizable compound including an ethylenically unsaturated bond, a photopolymerization initiator and a solvent.

In the curable resin composition, an alkali soluble resin allows the curable resin composition to have adhesive strength with a substrate and thus a coating may be formed, is dissolved in an alkali liquid developer to allow a fine pattern to be formed, and simultaneously serves to prevent an obtained pattern from being broken during a post-treatment process by imparting strength to the pattern. Further, the alkali soluble resin has great effects even on heat resistance and chemical resistance.

In general, the curable resin composition is formed as a coating film having a thickness of 3 μm or more and most of the coating film needs to be developed, and thus the curable resin composition needs to be dissolved in a large amount in a liquid developer within a short time period. In addition, when development is not clearly performed, various display defects such as direct spots due to residues and alignment defects of liquid crystals may occur. Therefore, the curable resin composition needs to have excellent developability. Moreover, when a curable resin composition is applied on a glass substrate with a large surface area, it is difficult for the substrate to be subjected to full-surface exposure, and thus the substrate is subjected to exposure in multiple sequences. Thus, when the curable resin composition has low sensitivity, the time needed for the exposure process becomes longer, resulting in a drop in productivity, and thus high sensitivity is required.

Moreover, even in a high temperature process at 200° C. or higher, excellent thermal stability for maintaining the shape and thickness, high compress strength sufficient to resist against external pressure and excellent chemical resistance are required. In addition, excellent stability with time may stably exhibit characteristics which are constantly required without any changes even under long-term storage conditions, and thus excellent stability with time is required. However, a curable resin composition that meets all the standards in terms of heat resistance, chemical resistance, developability, sensitivity and stability with time has not been yet developed.

Furthermore, in a process of using the above-described curable resin composition, in order to improve a yield per unit time of the process, exposure time and development time are reduced. Thus, there is a need for improving sensitivity and developability, compared to curable resin compositions that are known in the art.

Meanwhile, in a curable composition such as the curable resin composition, there are fundamental problems such as inability to improve resolution intrinsically in a pigment distribution system in the art, occurrence of color spots due to coarse particles of a pigment and the like, and thus the use of a dye has been required. However, a curable composition containing a dye is problematic in that various performances such as light resistance, heat resistance, solubility, coating uniformity and the like are poor, compared to a curable composition in which a pigment is used.

Therefore, there is a need for studies on a curable composition including a dye having excellent light resistance, heat resistance, solubility, coating uniformity and the like.

DISCLOSURE

Technical Problem

A problem to be solved by the present invention is to provide a polymer compound including a dye having excellent heat resistance, solubility, coating uniformity, chemical resistance and the like, and a curable resin composition including the same.

Technical Solution

An exemplary embodiment of the present invention provides a polymer compound including: a repeating unit represented by the following Formula 1; and one or more of repeating units represented by the following Formula 2 and Formula 3. The polymer compound may have a weight average molecular weight of 1,000 to 100,000.

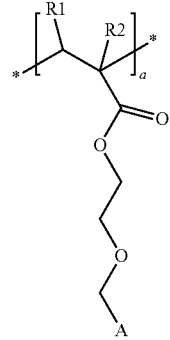

[Formula 1]

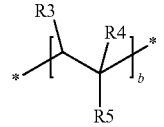

[Formula 2]

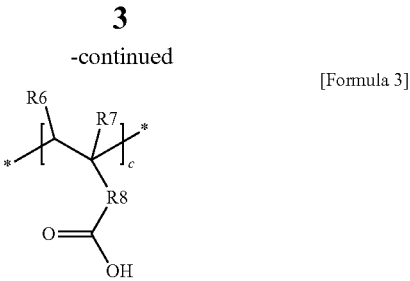

[Formula 3]

In Formula 1, Formula 2 and Formula 3,

R1 to R4 and R6 to R7 are the same as or different from each other, and each independently hydrogen or an alkyl group having 1 to 5 carbon atoms, R5 is selected from the group consisting of an alkyl ester group having 2 to 6 carbon atoms, which is unsubstituted or substituted with a phenyl group; and a phenyl ester group unsubstituted or substituted with an alkyl group having 1 to 3 carbon atoms or a halogen group, R8 is directly linked; or an alkylene group having 1 to 6 carbon atoms, which is unsubstituted or substituted with a halogen group or a phenyl group, A is a monovalent group derived from a dye, and a, b and c are a molar mixing ratio of the repeating unit, and each independently 5 to 50.

Further, an exemplary embodiment of the present invention provides a curable resin composition including: a binder resin including an alkali soluble polymer resin, a polymerizable compound including an ethylenically unsaturated bond, a photoinitiator, a solvent and a polymer compound including the repeating unit represented by Formula 1 and one or more of the repeating units of Formula 2 and Formula 3.

In addition, an exemplary embodiment of the present invention provides a photosensitive material prepared by using the curable resin composition.

Furthermore, an exemplary embodiment of the present invention provides an electronic device prepared by using the curable resin composition.

Advantageous Effects

A polymer compound including a dye according to an exemplary embodiment of the present invention and a curable resin composition including the same may exhibit characteristics such as excellent heat resistance, solubility, coating uniformity, chemical resistance, developability to an alkali aqueous solution and the like by introducing a single molecule type dye into a side chain of a polymer binder to be modified into a polymer form and applying the modified polymer to a curable composition.

MODE FOR INVENTION

Figure 1:
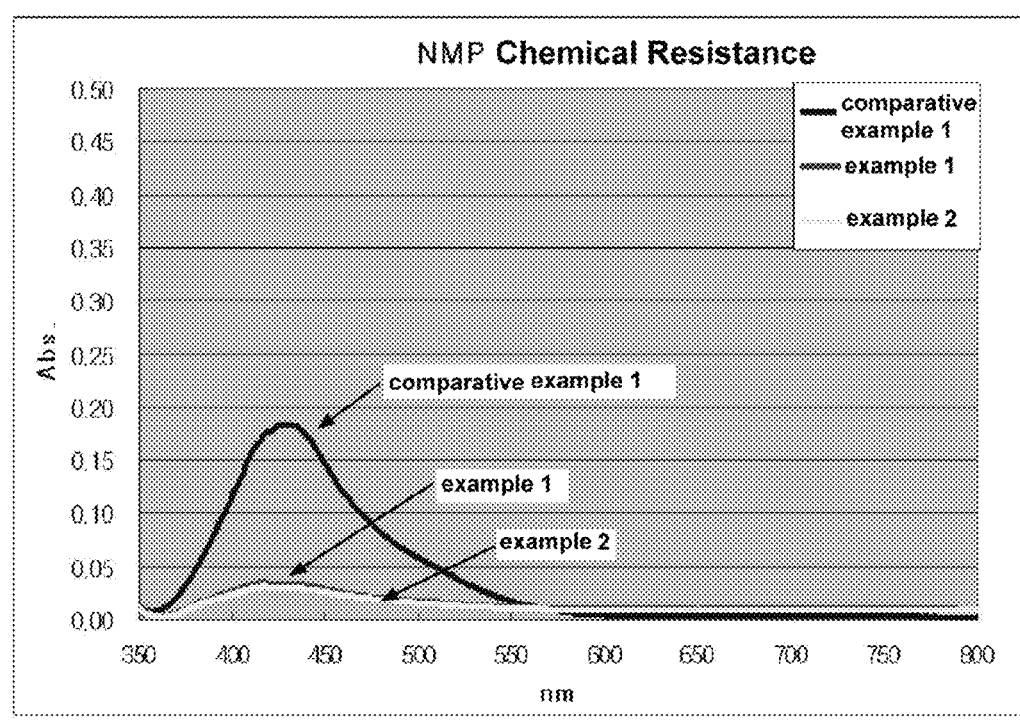
FIG. 1 is a graph showing the evaluation results of chemical resistance of curable resin compositions according to Examples 1 and 2 and Comparative Example 1 of the present invention.

Hereinafter, the present invention will be described in more detail.

A polymer compound according to an exemplary embodiment of the present invention includes the repeating unit represented by Formula 1, and one or more of the repeating units of Formula 2 and Formula 3.

Specifically, the polymer compound may include a repeating unit represented by Formula 1 and a repeating unit represented by Formula 2. Further, the polymer compound may include a repeating unit represented by Formula 1 and a repeating unit represented by Formula 3. In addition, the polymer compound may include a repeating unit represented by Formula 1, a repeating unit represented by Formula 2 and a repeating unit represented by Formula 3.

The polymer compound according to an exemplary embodiment of the present invention is modified into a polymer form by introducing a known single molecule type dye into a side chain of a polymer binder.

The known single low molecule type dye has a low solubility in a commercially available solvent and crystal type characteristics, and thus it was difficult to obtain a uniform thin film when the dye is applied in a thin film. However, the polymer compound according to the present invention may improve solubility in a commercially available solvent, coating uniformity and heat resistance by introducing a single molecule type dye into a side chain of a polymer binder.

In the polymer compound according to an exemplary embodiment of the present invention, the substituent group of Formula 1, Formula 2 and Formula 3 will be described in more detail as follows.

R1 to R4 and R6 to R7 are the same as or different from each other, and each independently hydrogen or an alkyl group having 1 to 5 carbon atoms.

R5 is selected from the group consisting of an alkyl ester group having 2 to 6 carbon atoms, which is unsubstituted or substituted with a phenyl group; and a phenyl ester group unsubstituted or substituted with an alkyl group having 1 to 3 carbon atoms or a halogen group.

R8 is directly linked; or an alkylene group having 1 to 6 carbon atoms, which is unsubstituted or substituted with a halogen group or a phenyl group.

The alkyl group may be a straight chain, a branched chain or a cyclic chain, and may be substituted or unsubstituted. Specific examples of the alkyl group include a methyl group, an ethyl group, a propyl group, an isopropyl group, a butyl group, a t-butyl group and the like, but are not limited thereto.

The alkylene group may be a straight chain or a branched chain, and may be substituted or unsubstituted. Specific examples of the alkylene group include methylene, ethylene, propylene, isopropylene, butylene, t-butylene and the like, but are not limited thereto.

The halogen group may be fluorine, chlorine, bromine or iodine.

The term "substituted or unsubstituted" means that substitution is carried out by one or more substituent groups or no substituent group is possessed.

In the present specification, "*" means a linking part between repeating units.

The a, b and c are a molar mixing ratio of the repeating unit, and a is 5 to 50, b is 5 to 50, and c is 5 to 50. The a:b:c may be 5 to 50:5 to 50:5 to 50.

The A in Formula 1 is a monovalent group derived from a dye. Examples of the dye include yellow dyes, red dyes, blue dyes and the like, but are not limited thereto.

As the yellow dye, Valifast Yellow 1108, Valifast Yellow 3108, Valifast Yellow 3120, Valifast Yellow 4120, Valifast Yellow 1151, Valifast Yellow 3150, Oil Yellow 129 and the like may be preferably used, as the red dye, Valifast Red 1306, Valifast Red 1308, Valifast Red 1360, Valifast Red 3304, Valifast Red 3311, Valifast Red 2320, Valifast Red 3305, Valifast Red 3320, Valifast Pink 2310N, PCRed136P and the like may be preferably used, and as the blue dye, Valifast Blue 2610, Valifast Blue 1603, Valifast Blue 1605, Valifast Blue 2620, Valifast Blue 2606 (all manufactured by Orient Chemical Industries Co., Ltd, Nippon Kayaku Co., Ltd) and the like may be preferably used.

Furthermore, as the dye, dyes such as pyrazole azo-based, anilino azo-based, arylazo-based, triphenylmethane-based, anthraquinone-based, anthrapyridone-based, benzilidene-based, oxonol-based, pyrazolotriazole azo-based, pyridone azo-based, cyanine-based, phenothiazine-based, pyrrolo pyrazole azomethine-based, xanthene-based, phthalocyanine-based, benzopyran-based, indigo-based dyes and the like may be preferably used.

The polymer compound according to an exemplary embodiment of the present invention may have a weight average molecular weight of 1,000 to 100,000.

A preparation method of the polymer compound according to an exemplary embodiment of the present invention is as follows.

First, a polymer including a repeating unit of Formula 1 and one or more of repeating units represented by Formula 2 or Formula 3 may be prepared by any one method of various polymerization methods known in the art, such as radical polymerization, cationic polymerization, anionic polymerization, condensation polymerization and the like, but radical polymerization is most preferably used in terms of ease of preparation or economical efficiency.

For example, preparation may be carried out by mixing a single molecule type dye into which a polymerizable unsaturated double bond group constituting a Formula 1 part is introduced and one more monomers for forming repeating units represented by Formula 2 or Formula 3 with a polymerization solvent, heating the mixture to an appropriate temperature, then removing oxygen through nitrogen purging, introducing a radical polymerization initiator and a chain transfer agent if necessary, and maintaining the resulting mixture at a polymerization temperature. In the method, polymerization temperature and polymerization time may be determined by considering a half-life of the polymerization initiator used according to the temperature. For example, the half-life of 2,2'-azobisisobutyronitrile (AIBN) at 70° C. is 4.8 hours, and thus when the compound is used, the polymerization time is preferably 6 hours or more. In general, the polymerization temperature is preferably 50° C. to 150° C., and the polymerization time is preferably 30 minutes to 48 hours.

The polymer compound according to an exemplary embodiment of the present invention may be represented by the following Formula 4 or Formula 5, but is not limited thereto.

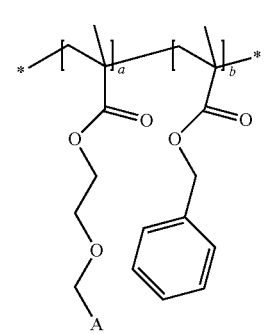

[Formula 4]

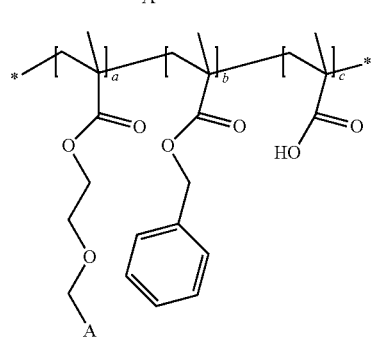

[Formula 5]

In Formula 4 and Formula 5, a, b and c have the same definition as in Formula 1, Formula 2 and Formula 3. Specifically, in Formula 4, the a:b may be 5 to 50:5 to 50, and in Formula 5, a:b:c may be 5 to 50:5 to 50:5 to 50.

Further, the curable resin composition according to an exemplary embodiment of the present invention includes a polymer compound including the repeating unit represented by Formula 1 and one or more of the repeating units of Formula 2 and Formula 3, a binder resin including an alkali soluble polymer resin, a polymerizable compound including an ethylenically unsaturated bond, a photoinitiator and a solvent.

In the curable resin composition according to the present invention, the content of the polymer compound is preferably 0.1 wt % to 10 wt % based on the total weight of the curable resin composition.

In the curable resin composition according to an exemplary embodiment of the present invention, resins typically used in the art, such as alkali soluble binder resins and the like may be used as the binder resin. Specifically, an acrylic binder resin containing an alkali soluble carboxyl group may be used, and an acrylic binder resin having a weight average molecular weight of preferably 3,000 to 150,000 may be used.

The content of the binder resin is preferably 1 wt % to 20 wt % based on the total weight of the curable resin composition, but is not limited thereto.

In the curable resin composition according to an exemplary embodiment of the present invention, as the polymerizable compound including an ethylenically unsaturated bond, one or more compounds selected from pentaerythritol tri(meth)acrylate, pentaerythritol tetra(meth)acrylate, ethylene glycol di(meth)acrylate, polyethylene glycol di(meth)acrylate and the like may be used, but are not limited thereto.

The content of the polymerizable compound including an ethylenically unsaturated bond is preferably 1 wt % to 30 wt % based on the total weight of the curable resin composition, but is not limited thereto.

In the curable resin composition according to an exemplary embodiment of the present invention, as the photoinitiator, one or more compounds selected from 2,4-trichloromethyl-(4'-methoxyphenyl)-6-triazine, 2,4-trichloromethyl-(4'-methoxystyryl)-6-triazine, 2,4-trichloromethyl-(pyflonyl)-6-triazine, 1-hydroxycyclohexyl phenyl ketone, 4-(2-hydroxyethoxy)-phenyl (2-hydroxy)propyl ketone, benzophenone, 2,4,6-trimethylaminobenzophenone and the like may be used, but are not limited thereto.

The content of the photoinitiator is preferably 0.1 wt % to 5 wt % based on the total weight of the curable resin composition, but is not limited thereto.

In the curable resin composition according to an exemplary embodiment of the present invention, as the solvent, one or more compounds selected from methyl ethyl ketone, propylene glycol diethyl ether, propylene glycol methyl ether acetate, 3-methoxybutyl acetate, dipropylene glycol monomethyl ether and the like may be used, but are not limited thereto.

The content of the solvent is preferably 45 wt % to 95 wt % based on the total weight of the curable resin composition, but is not limited thereto.

In addition, the curable resin composition according to an exemplary embodiment of the present invention may additionally include one or two or more additives selected from the group consisting of a colorant, a curing accelerator, a thermal polymerization inhibitor, a dispersing agent, an antioxidant, an ultraviolet ray absorbing agent, a leveling agent, a photosensitizer, a plasticizer, an adhesion promoter, a filler and a surfactant according to the use thereof.

As the colorant, one or more pigments, dyes or mixtures thereof may be used. Specific examples of a black pigment include metal oxides and the like, such as carbon black, graphite, titan black and the like. Examples of carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon Co., Ltd.); diagram black II, diagram black N339, diagram black SH, diagram black H, diagram LH, diagram HA, diagram SF, diagram N550M, diagram M, diagram E, diagram G, diagram R, diagram N760M, diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corporation); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, RAVEN-1170 (Columbia Carbon Co.), mixtures thereof, or the like. Furthermore, examples of a colored colorant include Carmine 6B (C.I. 12490), Phthalocyanine Green (C.I. 74260), Phthalocyanine Blue (C.I. 74160), Perylene Black (BASF K0084 and K0086), Cyanine Black, Lionol Yellow (C.I. 21090), Lionol Yellow GRO (C.I. 21090), Benzidine Yellow 4T-564D, Victoria Pure Blue (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, 272; C.I. PIGMENT GREEN 7, 36; C.I. PIGMENT BLUE 15:1, 15:3, 15:4, 15:6, 16, 22, 28, 36, 60, 64; C.I. PIGMENT YELLOW 13, 14, 35, 53, 83, 93, 95, 110, 120, 138, 139, 150, 151, 154, 175, 180, 181, 185, 194, 213; and C.I. PIGMENT VIOLET 15, 19, 23, 29, 32, 37. Besides, a white pigment, a fluorescent pigment and the like may also be used. As a phthalocyanine-based complex used as the pigment, materials using zinc other than copper as a central metal may also be used.

Examples of the curing accelerator include one or more selected from the group consisting of 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate) and trimethylolethane tris(3-mercaptopropionate), but are not limited thereto and may include those typically known in the art.

Examples of the thermal polymerization inhibitor include one or more selected from the group consisting of p-anisole, hydroquinone, pyrocatechol, t-butyl catechol, N-nitrosophenylhydroxyamineammonium salt, N-nitrosophenylhydroxyamine aluminum salt and phenothiazine, but are not limited thereto and may include those typically known in the art.

As the surfactant, the photosensitizer, the plasticizer, the adhesion promoter, the filler, or the like, any compounds that may be included in the curable resin composition known in the art may be used.

The content of the colorant is preferably 1 wt % to 20 wt % based on the total weight of the curable resin composition, and the contents of the other additives are each independently preferably 0.01 wt % to 5 wt % based on the total weight of the curable resin composition, but are not limited thereto.

An exemplary embodiment of the present invention provides a photosensitive material including the curable resin composition.

An exemplary embodiment of the present invention provides a photosensitive material prepared by using the curable resin composition.

Meanwhile, the curable resin composition according to an exemplary embodiment of the present invention may be used in a roll coater, a curtain coater, a spin coater, a slot die coater, various printings, dipping and the like, and may be applied on a support such as metal, paper, a glass plastic substrate and the like. Further, the curable resin composition may be transferred to other supporters after the composition is applied on a support such as film and the like, or may be transferred to a blanket and the like and again transferred to a second support after the composition is applied on a first support. There are no particular limitations on the application methods.

Examples of light sources for curing the curable resin composition according to an exemplary embodiment of the present invention include a mercury vapor arc, a carbon arc, a xenon (Xe) arc and the like, which emit light having a wavelength of 250 nm to 450 nm, but are not limited thereto.

According to an exemplary embodiment of the present invention, heat resistance, solubility, coating uniformity, chemical resistance and the like, which were problematic when a known single molecule type dye was used, may be improved by using a polymer including a dye as a color material in the curable resin composition, thereby increasing effects of using the dye maximally.

In addition, the single molecule type dye has a low solubility in a commercially available solvent and crystal type characteristics, and thus there is a problem in that it is to obtain a uniform thin film when the dye is applied in a thin film. However, in the polymer type dye according to the present invention, it is possible to obtain a result that the dye has excellent solubility in a commercially available solvent, coating uniformity is greatly improved, and heat resistance is greatly improved.

The curable resin composition according to an exemplary embodiment of the present invention is preferably used in a pigment dispersion type photosensitive material for manufacturing a TFT LCD color filter, a photosensitive material for forming a black matrix of a TFT LCD or organic light emitting diode, a photosensitive material for forming an overcoat layer and a photosensitive material for a column spacer, but may be used in the manufacture of a photocurable paint, a photocurable ink, a photocurable adhesive, a printing plate, a photosensitive material for a printed circuit board, other transparent photosensitive materials and PDP, and the like. There are no particular limitations on in the use thereof.

An exemplary embodiment of the present invention provides an electronic device prepared by using the curable resin composition.

Hereinafter, Synthetic Examples, Examples and Comparative Examples will be provided for better understanding of the present invention. However, the following Synthetic Examples and Examples are for illustrative purposes only, and the scope of the present invention is not limited thereto in any manner.

Synthetic Example 1

A polymer compound of Formula 4, into which a dye including an unsaturated double bond of the following Formula A-1 had been introduced, was synthesized.

[Formula A-1]

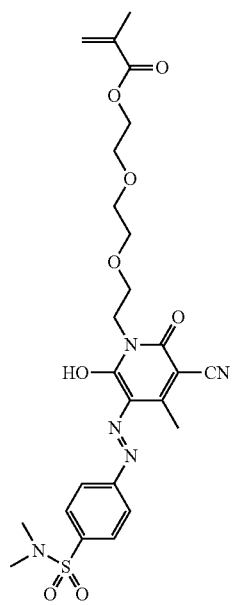

72 g of benzyl methacrylate, 28 g of a dye monomer including an unsaturated double bond, 2 g of 3-mercaptopropionic acid as a chain transfer agent and 300 g of tetrahydrofuran as a solvent were mixed under nitrogen atmosphere for 30 min by a mechanical stirrer. The temperature of the reactor under nitrogen atmosphere was increased to 70° C., and when the temperature of the mixture reached 70° C., 3.3 g of AIBN as a thermal polymerization initiator was added thereto and the resulting mixture was stirred for 8 hr. The temperature of the reactor in which the polymer was polymerized was increased to 80° C. and the reactor was stirred for 30 min to synthesize a desired resin.

The acrylic resin had an acid value of 0 mgKOH/g. The weight average molecular weight in terms of polystyrene measured by GPC was 11,000 g/mol.

[Formula 4]

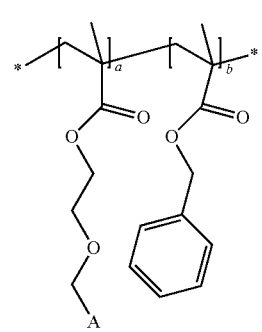

Synthetic Example 2

A polymer compound of Formula 5, into which a dye including an unsaturated double bond of Formula A-1 used in the Synthetic Example 1 had been introduced, was synthesized.

40 g of benzyl methacrylate, 50 g of a dye monomer including an unsaturated double bond, 10 g of methacrylic acid and 300 g of tetrahydrofuran as a solvent were mixed under nitrogen atmosphere for 30 min by a mechanical stirrer. The temperature of the reactor under nitrogen atmosphere was increased to 70° C., and when the temperature of the mixture reached 70° C., 3.3 g of AIBN as a thermal polymerization initiator was added thereto and the resulting mixture was stirred for 8 hr. The temperature of the reactor in which the polymer was polymerized was increased to 80° C. and the reactor was stirred for 30 min to synthesize a desired resin.

The acrylic resin had an acid value of 60 mgKOH/g. The weight average molecular weight in terms of polystyrene measured by GPC was 30,000 g/mol.

[Formula 5]

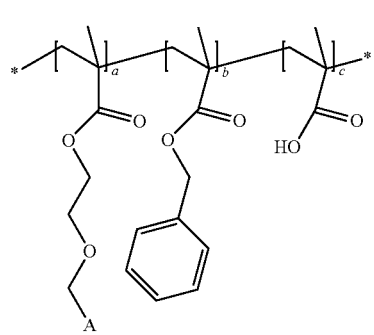

Examples 1 to 4 and Comparative Examples 1 and 2

As described in the following Table 1, a curable resin composition using a polymer including the dye according to the present invention was prepared. In Comparative Example 1 and Comparative Example 2, a dye of Formula A-2 was used.

[Formula A-2]

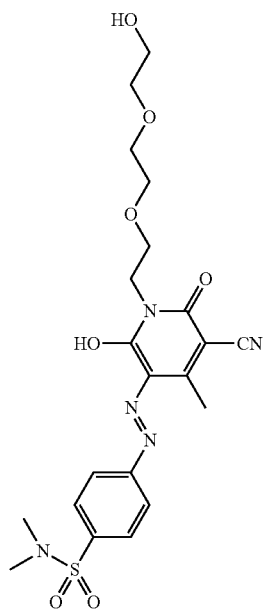

TABLE 2

| Composition | ΔEab | | |
|---|---|---|---|
| | PB First Time | PB Second Time | 2 hr Baking |
| Comparative Example 1 | 71 | 72 | 74 |
| Example 1 | 37 | 51 | 63 |
| Example 2 | 20 | 28 | 38 |
| Comparative Example 2 | 6 | 8 | 10 |
| Example 3 | 3 | 5 | 6 |
| Example 4 | 2 | 3 | 4 |

As the results in Table 2, it can be known that the curable resin compositions including the polymer type dye in Example 1 and Example 2 according to the present invention have been greatly improved in terms of heat resistance, compared to the composition of Comparative Example 1 to which a single molecule type dye is applied as it is.

Experimental Example 2

Specimens were prepared by using the curable resin compositions in Examples 1 and 2 and Comparative Example 1, then prebaking (100° C., 70 sec), exposure (40 mJ) and post baking (230° C., 20 min) were performed, and chemical resistance was evaluated by using an N-methyl-2-pyrrolidone (NMP) solvent. The results are shown in the following FIG. 1.

As shown in the results in the following FIG. 1, it can be known that the curable resin compositions including the polymer type dye in Example 1 and Example 2 according to the present invention have been greatly improved in terms of chemical resistance to the NMP solvent, compared to the composition of Comparative Example 1 to which a single molecule type dye is applied as it is.

TABLE 2

| | A-2 | Synthetic Example 1 | Synthetic Example 2 | Green pigment | Binder resin | Polymerizable compound | Photoinitiator | Solvent |
|---|---|---|---|---|---|---|---|---|
| Comparative Example 1 | 1 | | | | 8.5 | 8.5 | 2 | 80 |
| Comparative Example 2 | 0.5 | | | 3.5 | 4.5 | 4.5 | 2 | 85 |
| Example 1 | | 1.7 | | | 7.8 | 8.5 | 2 | 80 |
| Example 2 | | | 2 | | 7.5 | 8.5 | 2 | 80 |
| Example 3 | | 0.85 | | 3.5 | 4.15 | 4.5 | 2 | 85 |
| Example 4 | | | 1 | 3.5 | 4 | 4.5 | 2 | 85 |

Comparative Example 1: Curable Resin Composition Including Low Molecule Type Dye (A-2)
Comparative Example 2: Curable Resin Composition Including Low Molecule Type Dye (A-2) and Green Pigment (G58)
Example 1: Curable Resin Composition Including Polymer of Synthetic Example 1
Example 2: Curable Resin Composition Including Polymer of Synthetic Example 2
Example 3: Curable Resin Composition Including Polymer of Synthetic Example 1 and Green Pigment (G58)
Example 4: Curable Resin Composition Including Polymer of Synthetic Example 2 and Green Pigment (G58)

Experimental Example 1

Specimens were prepared by using the curable resin composition in Examples 1 to 4 and Comparative Examples 1 and 2, and then heat resistance was evaluated by comparing spectra before and after the post baking (PB) under the condition of PB at 230° C. The results are shown in the following Table 2.

Experimental Example 3

Figure 3:
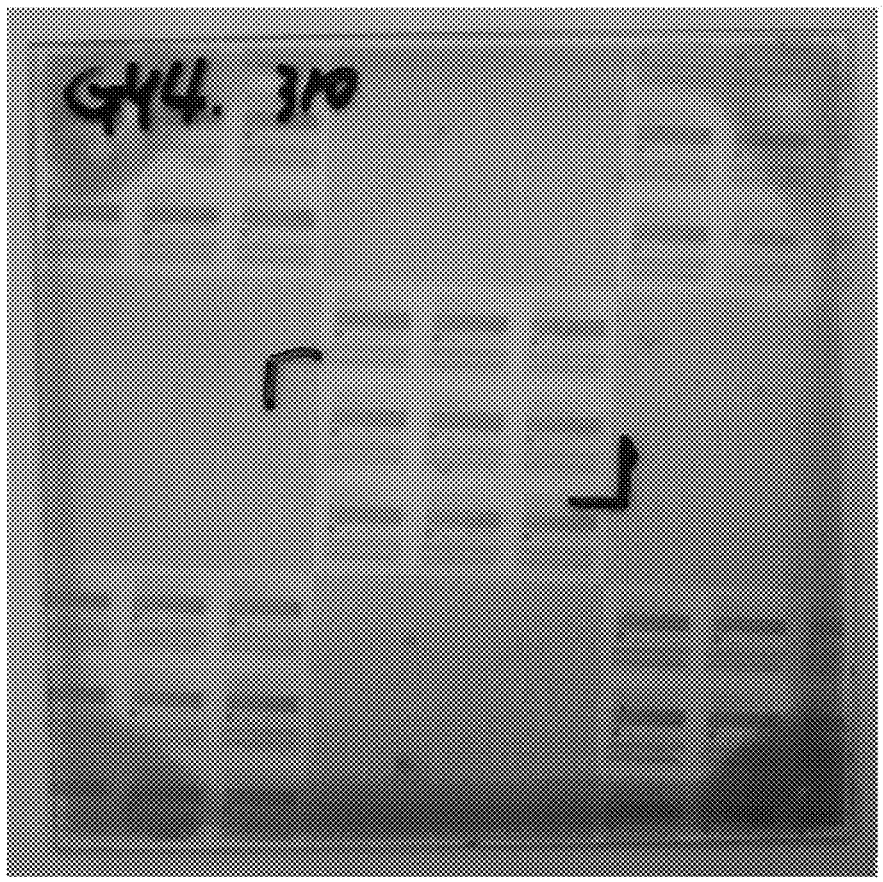
FIG. 3 is a photo showing the evaluation result of developability of the curable resin composition according to Example 1 of the present invention.
Figure 4:
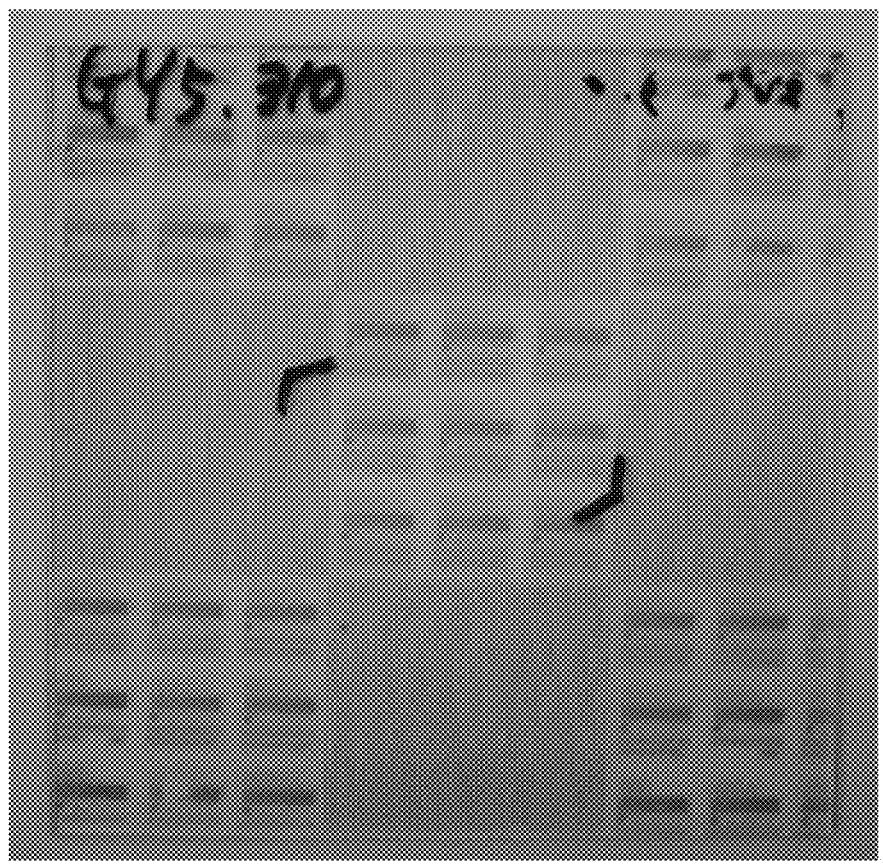
FIG. 4 is a photo showing the evaluation result of developability of the curable resin composition according to Example 2 of the present invention.

Specimens were prepared by using the curable resin compositions in Example 3, Example 4 and Comparative Example 2, and then developability was evaluated by performing the developing process. The results are shown in the following FIGS. 2 to 4.

Figure 2:
FIG. 2 is a photo showing the evaluation result of developability of the curable resin composition according to Comparative Example 1 of the present invention.

As shown in the following FIG. 2, it can be known that in the curable resin composition using the low molecule type dye in Comparative Example 2, lifting on a glass substrate occurs due to insufficient adhesion characteristics of the pattern. As shown in the following FIGS. 3 and 4, it can be known that in the curable resin composition including polymer type dyes in Example 3 and 4 according to the present invention, adhesion strength on the substrate has been greatly improved and fine patterns are well formed. In particular, it can be known that in the curable resin composition including the polymer type dye into which the acid group in Example 4 has been introduced, adhesion strength and developability have been greatly improved.

The invention claimed is:

1. A polymer compound comprising:
a repeating unit represented by the following Formula 1; and
a repeating unit represented by the following Formula 2:

[Formula 1]

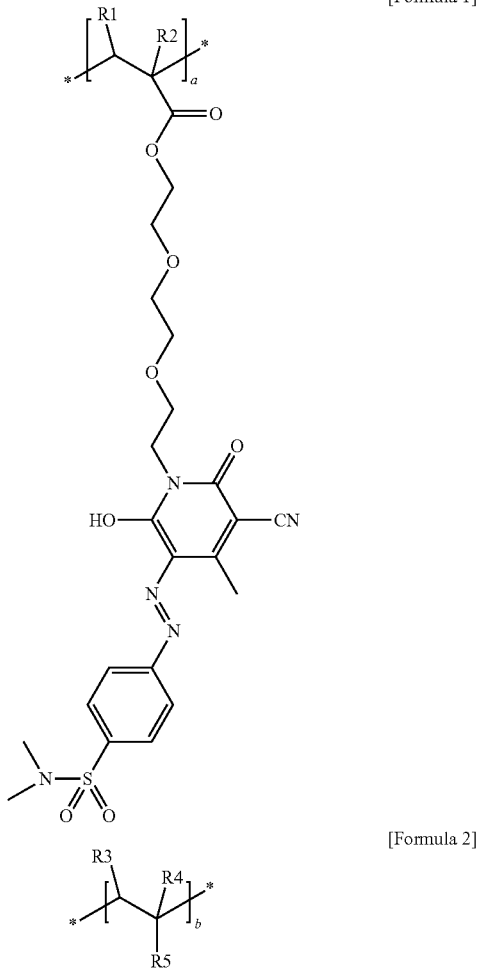

[Formula 2]

wherein R1 to R4 are the same as or different from each other, and each independently hydrogen or an alkyl group having 1 to 5 carbon atoms,
R5 is a benzyl ester group,
and
a and b are a molar mixing ratio of the repeating unit, and each independently 5 to 50.

2. The polymer compound of claim 1, wherein the polymer compound have a weight average molecular weight of 1,000 to 100,000.

3. The polymer compound of claim 1, wherein the polymer compound comprises a repeating unit represented by the following Formula 4:

[Formula 4]

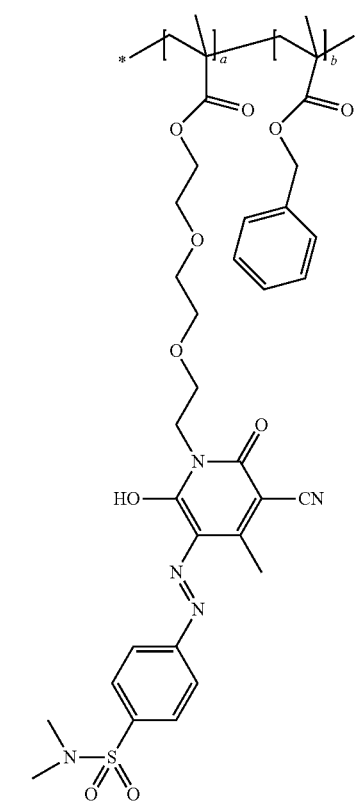

wherein a and b are a molar mixing ratio, and each independently 5 to 50.

4. The polymer compound of claim 1, wherein the polymer compound comprises a repeating unit represented by the following Formula 5:

[Formula 5]

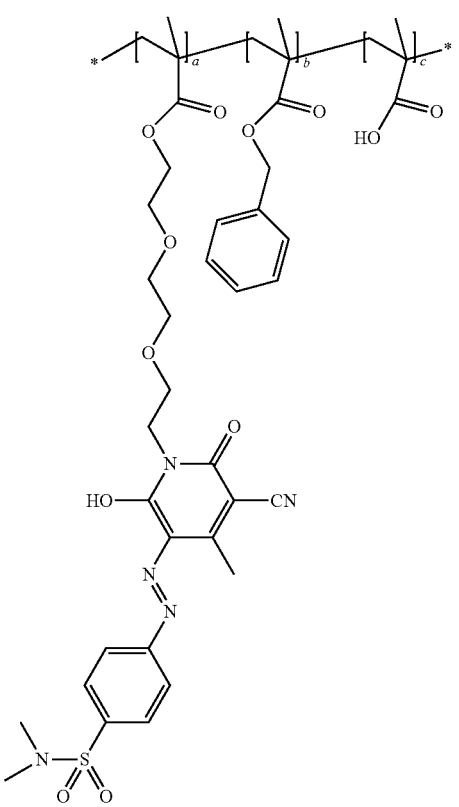

wherein a, b and c are a molar mixing ratio, and each independently 5 to 50.

5. A curable resin composition comprising:
the polymer compound of claim 1;
a binder resin comprising an alkali soluble polymer resin;
a polymerizable compound comprising an ethylenically unsaturated bond; a photoinitiator; and
a solvent.

6. The curable resin composition of claim 5, wherein a content of the polymer compound is 0.1 wt % to 10 wt % based on a total weight of the curable resin composition.

7. The curable resin composition of claim 5, wherein the binder resin comprising the alkali soluble polymer resin has a weight average molecular weight of 3,000 to 150,000.

8. The curable resin composition of claim 5, wherein a content of the binder resin comprising the alkali soluble polymer resin is 1 wt % to 20 wt % based on a total weight of the curable resin composition.

9. The curable resin composition of claim 5, wherein a content of the polymerizable compound comprising the ethylenically unsaturated bond is 0.5 wt % to 30 wt % based on a total weight of the curable resin composition.

10. The curable resin composition of claim 5, wherein a content of the photoinitiator is 0.1 wt % to 5 wt % based on a total weight of the curable resin composition.

11. The curable resin composition of claim 5, wherein a content of the solvent is 40 wt % to 95 wt % based on a total weight of the curable resin composition.

12. The curable resin composition of claim 5, further comprising:
one or two or more additives selected from the group consisting of a curing accelerator, a thermal polymerization inhibitor, a dispersing agent, an antioxidant, an ultraviolet ray absorbing agent, a leveling agent, a photosensitizer, a plasticizer, an adhesion promoter, a filler and a surfactant.

13. The curable resin composition of claim 12, wherein a content of the additive is each 0.01 wt % to 5 wt % based on a total weight of the curable resin composition.

14. A photosensitive material prepared by using the curable resin composition of claim 5.

15. The photosensitive material of claim 14, wherein the photosensitive material is selected from the group consisting of a pigment dispersion type photosensitive material for manufacturing a TFT LCD color filter, a photosensitive material for forming a black matrix of a TFT LCD or organic light emitting diode, a photosensitive material for forming an overcoat layer, a photosensitive material for a column spacer and a photosensitive material for a printed wiring board.

16. An electronic device comprising a cured product of the curable resin composition of claim 5.

17. The polymer compound of claim 1, further comprising:
a repeating unit represented by the following Formula 3:

[Formula 3]

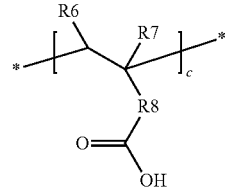

wherein R6 to R7 are the same as or different from each other, and each independently hydrogen or an alkyl group having 1 to 5 carbon atoms,
R8 is directly linked; or an alkylene group having 1 to 6 carbon atoms, which is unsubstituted or substituted with a halogen group or a phenyl group,
c is a molar mixing ratio of the repeating unit, and each independently 5 to 50.

* * * * *